United States Patent [19]

Shu et al.

[11] Patent Number: 5,675,179
[45] Date of Patent: Oct. 7, 1997

[54] UNIVERSAL TEST DIE AND METHOD FOR FINE PAD PITCH DESIGNS

[75] Inventors: William K. Shu, Sunnyvale; Brian D. Richardson, Saratoga, both of Calif.

[73] Assignee: VLSI Technology, Inc., San Jose, Calif.

[21] Appl. No.: 372,085

[22] Filed: Jan. 13, 1995

[51] Int. Cl.$^6$ .................................................. H01L 23/495
[52] U.S. Cl. ...................... 257/668; 257/734; 257/736; 257/737; 257/738; 257/739; 257/750; 257/773; 257/781; 257/782; 257/48
[58] Field of Search ........................ 257/668, 738, 257/739, 734, 736, 737, 750, 773, 781, 782, 48

[56] References Cited

U.S. PATENT DOCUMENTS

| | | | |
|---|---|---|---|
| Re. 35,119 | 12/1995 | Blonder et al. | 257/739 |
| 3,517,278 | 6/1970 | Hager | 257/738 |
| 5,501,006 | 3/1996 | Gehman et al. | 257/668 |

*Primary Examiner*—Edward Wojciechowicz
*Attorney, Agent, or Firm*—Majestic, Parsons, Siebert & Hsue

[57] ABSTRACT

A universal semiconductor interconnect test structure and method for using the test structure is provided for detecting the presence of electrical open or short circuits within the test package. In one embodiment, the test structure comprises a layer of electrically non-conductive substrate and a bonding layer of electrically conductive material over the substrate layer. In a second embodiment, the universal test die comprises a layer of electrically non-conductive substrate and a pattern of electrically conductive material over the substrate layer, wherein the pattern forms a continuous array of individual bonding areas, each of the bonding areas being electrically isolated from adjacent bonding areas by a gap, and wherein the effective pitch of the bonding areas is not more than 25 microns. The universal test die of the present invention is suitable for developing wire bond and mold processes for all pad pitches, all pad layout designs, all package types, and all pin counts. The test die of the present invention greatly accelerates fine pitch development and avoids the burden of multiple test die inventory control. Additionally, the test die of the present invention simplifies wire bond programming and test program development.

9 Claims, 3 Drawing Sheets

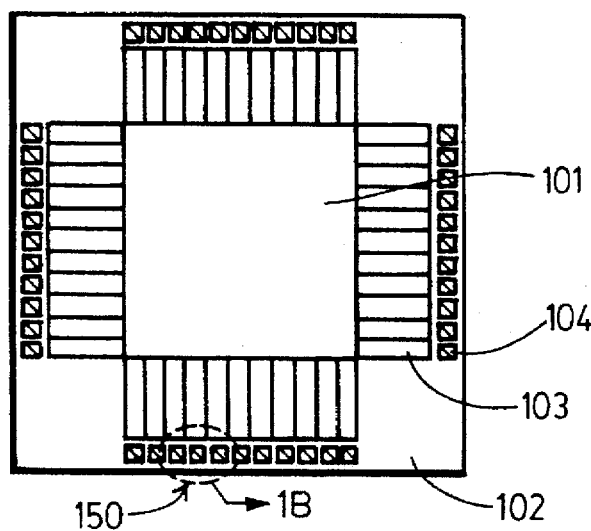
FIG. __1A.
(Prior Art)
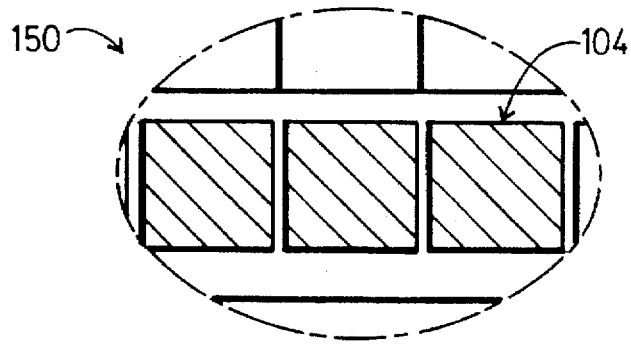
FIG. __1B.
(Prior Art)
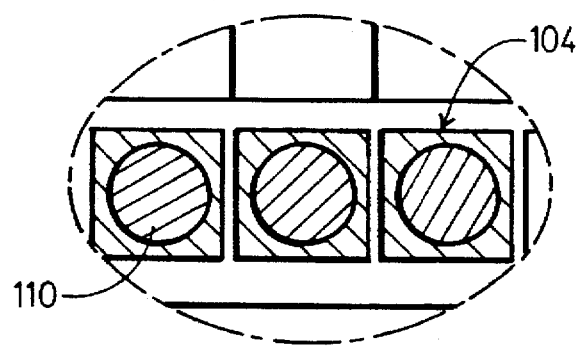
FIG. __1C.
(Prior Art)

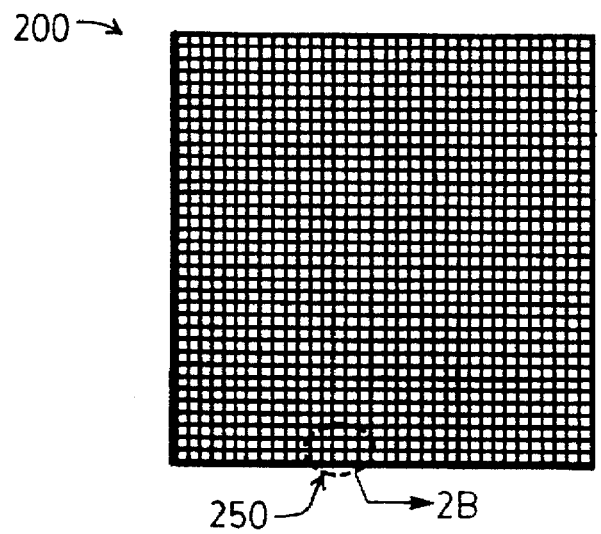
FIG._2A.
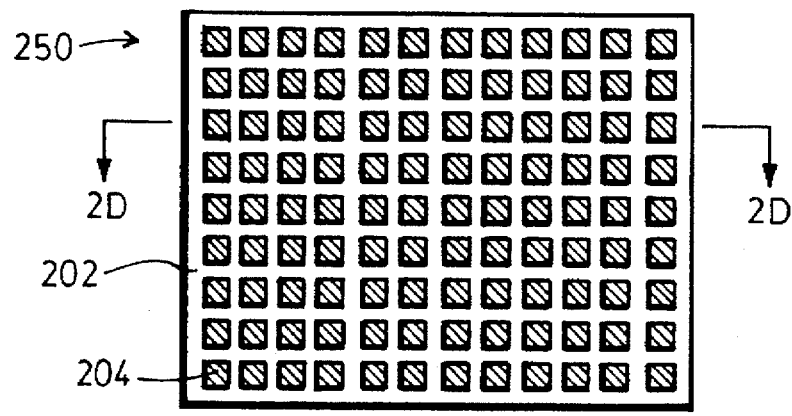
FIG._2B.
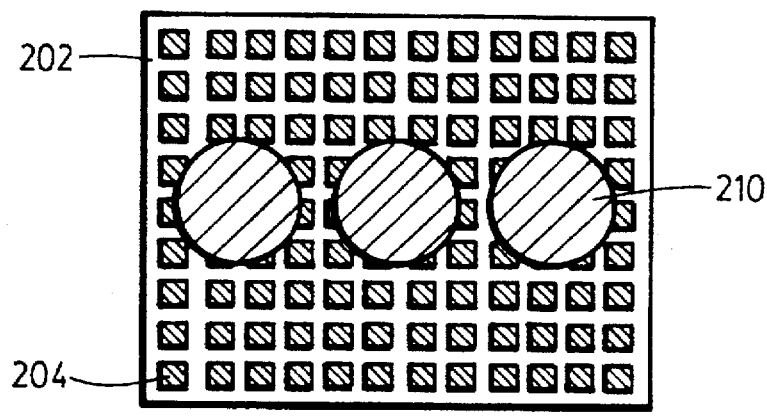
FIG._2C.

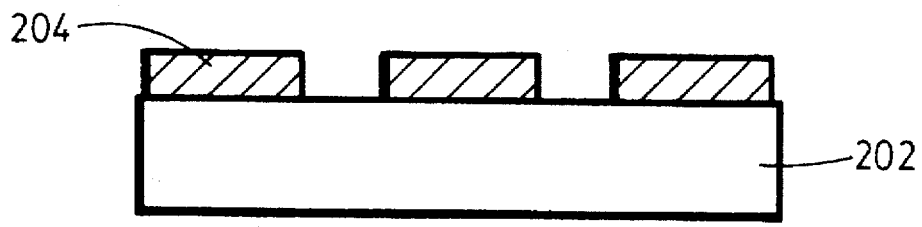
FIG._2D.
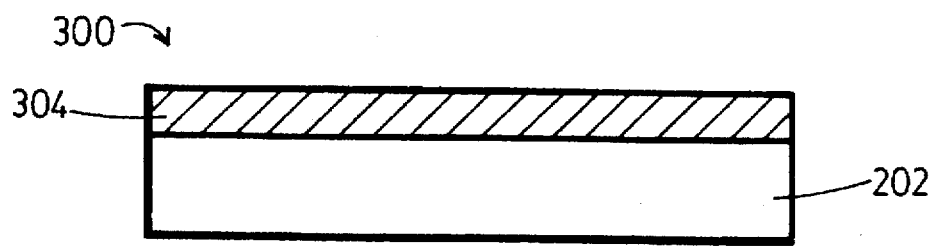
FIG._3A.
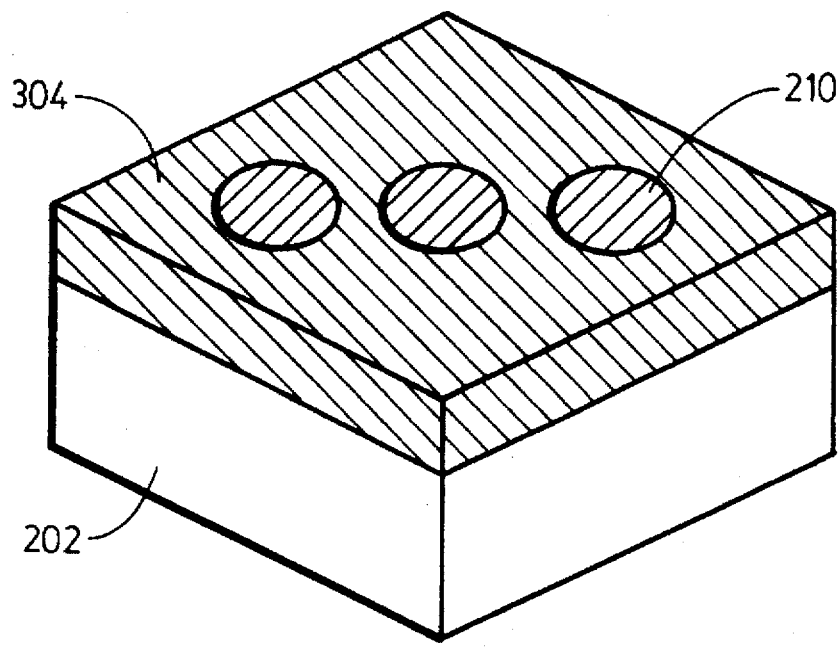
FIG._3B.

UNIVERSAL TEST DIE AND METHOD FOR FINE PAD PITCH DESIGNS

BACKGROUND OF THE INVENTION

The present invention relates generally to integrated circuit chip packages, and more particularly to an apparatus and method for universally testing new techniques developed in the area of inner lead interconnect technology.

Wire bond technology is commonly used in many of today's integrated circuit chip packages for providing electrical interconnection between the integrated circuit on a semiconductor die and the external leads of the package. As the ability to reduce the physical size of semiconductor circuits increases, there exists a corresponding need to increase the number of electrical connections to such circuits. Connections to integrated circuits on a semiconductor die are typically achieved by electrical connection to bond pads which are located on the die, adjacent to the integrated circuit. Thus, as the physical size of semiconductor circuit decreases, it is desirable to decrease the physical space occupied by the bond pads on the semiconductor die.

However, the ability to reduce the physical space occupied by the bond pads on the semiconductor die is limited by conventional technology. For example, in wire bond technology, the physical dimensions of each bond pad must provide sufficient surface area for attachment of a bonding wire thereto. Thus, the length and width dimensions of a particular bond pad must be equal to or larger than the diameter of the bonding wire which will be electrically connected to the bond pad.

Additionally, the pitch of the bond pads is also limited by conventional technology. For example, where the pitch between adjacent bond pads is less than 6.2 mils, short circuiting problems are often encountered. These short circuiting problems are typically caused by (1) the contact of adjacent bonding wires due to the wires being too close together, and/or by (2) the spreading of the metallic bonding material (e.g. gold bond ball) used to electrically connect the bonding wire to the bond pad, wherein the bond ball encroaches upon and contacts adjacent bond pads. Because of these problems, conventional wire bonding techniques limit the bond pad pitch of a linear row of bond pads on a semiconductor die to about 6.2 mils.

As technology progresses, however, new and more advanced wire bonding techniques are devised in order to reduce the bond pad pitch on the semiconductor die. For example, one technique for reducing the bond pad pitch is to rearrange the physical location of the bond pads from a linear arrangement to a staggered arrangement, wherein the bond pads form a plurality of staggered rows. In a linear row arrangement, the bond pad pitch is determined by the distance between adjacent bond pads, as measured from the center of each bond pad. In a staggered arrangement (i.e., where the bond pads are arranged into a plurality of staggered rows), the "effective" bond pad pitch is determined by measuring the linear distance between two parallel lines, where the first parallel line intersects the center of a bond pad in a first row, and the second parallel line intersects the center of an adjacent bond pad in an adjacent row. Using the staggered bond pad technique, the effective bond pad pitch may be reduced to as low as 3.2 mils.

Efforts are continually undertaken to improve wire bonding technology and to reduce the effective pitch of the bond pads on the semiconductor die. However, each new and/or improved wire bonding technique must be physically tested on at least one actual semiconductor test die in order to evaluate its effectiveness. The physical testing of an improved wire bonding technique on an actual test die is expensive and time-consuming. For example, each new fine pad pitch design requires a series of test dice for wire bond and molding process development. This is because each package type and/or body size requires different assembly setup. As the pad pitch becomes smaller, the roll of the test dice becomes more important because the margin of error diminishes drastically. Moreover, die design and test program development are tedious and time-consuming. As the package type proliferates, the task of test die design and test program development becomes a bottleneck to fine pad pitch development, as described below.

Designing a new test die with a new bond pad layout is a tedious and time-consuming task. First, design engineer support is typically needed in order to design the layout and mask work of the new test die. Next, the newly designed test die must be fabricated, which typically requires the assistance of fabrication support engineers. The design and fabrication of a specific test die typically takes about ten weeks.

After the test die has been designed and fabricated, a new wire bond program must be developed on an automatic wire bonder for physically implementing the new wire bonding technique. Wire bonding is performed by manually programming each bond according to each bond pad location on the die, as it is shown on a wire bonder monitor. Each wire must be bonded one at a time. Moreover, since there are two bonding locations for each bonding wire, and since each bonding location must be programmed one at a time using the monitor, the development of a new wire bond program is a tedious process.

Moreover, the above-described problems relate to a specific body size of a particular type of package. That is to say, for each different body size, bond pad pitch, pin count, and/or different package type tested, the above-described problems will be encountered. Therefore, the testing of the new wire bond technology is exacerbated where the technique is tested upon different body sizes, package types, pin counts, and/or different bond pad pitches.

It is therefore an object of the present invention to overcome the problems and disadvantages associated with the above-described technique for fabricating, designing and testing advancements in wire bond technology. It is a further objective of the present invention to provide a low cost, simple apparatus and method which can be used universally to test developing wire bond and molding processes for all pad pitches, all pad layout designs, all package types, and all pin counts.

SUMMARY OF THE INVENTION

These and additional objects are accomplished by the various aspects of the present invention wherein briefly, according to a first aspect, a universal semiconductor interconnect test structure and method for using the test structure is provided for detecting the presence of open circuits within the test package. The test structure comprises a layer of electrically non-conductive substrate and a bonding layer of electrically conductive material over the substrate layer. A plurality of electrically conductive interconnects are then bonded to the bonding layer, resulting in each of the interconnects being electrically connected to each other. Each interconnect may include a bonding wire, resulting in each of the plurality of bonding wires to be electrically connected to each other. Since each of the interconnects are electrically connected to each other in the test structure, the presence of an open circuit within the test structure is quickly and easily detected.

A second aspect of the present invention is directed to a universal semiconductor test die and method for using such test die in order to detect short circuits within a test package. The test die comprises a layer of electrically non-conductive substrate and a pattern of electrically conductive material over the substrate layer, wherein the pattern forms a continuous array of individual bonding areas, each of the bonding areas being electrically isolated from adjacent bonding areas by a gap, and wherein the effective pitch of the bonding areas is not more than 25 microns. After the test die has been formed, a plurality of interconnects are bonded to a plurality of bonding areas on the test die, wherein each of the interconnects is electrically bonded to a respective multiplicity of bonding areas such that each interconnect is electrically isolated from each other interconnect. Each interconnect may include a respective bonding wire, resulting in each of the bonding wires being electrically isolated from each other bonding wire. The interconnects may then be tested for the presence of electrical short circuits. Such testing may be performed after the package has been encapsulated within a body of electrically non-conductive material.

A third aspect of the present invention is directed to a method for testing a semiconductor interconnect bonding technique. The method comprises the steps of providing a prefabricated test structure comprising a layer of electrically non-conductive substrate and a bonding layer of electrically conductive material over the substrate layer; physically altering the dimensions of the test structure by removing or cutting away portions of the structure in order to form a test die which approximates the surface area dimensions of an actual integrated circuit die which is to be emulated; bonding a plurality of electrically conductive interconnects to the bonding layer to the test die; and testing the integrity of the bonding technique, wherein each interconnect is electrically tested to determine if it is electrically connected to at least one of the other plurality of interconnects.

Using the technique of the present invention, it becomes possible to provide a universal electrical test die that is suitable for developing wire bond and mold processes for all pad pitches, all pad layout designs, all package types, and all pin counts. The test die of the present invention greatly accelerates fine pitch development and avoids the burden of multiple test die inventory control. Additionally, the test die of the present invention simplifies wire bond programming and test program development.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIG. 1A illustrates a top view of a conventional test die used for testing fine pad pitch development.

FIG. 1B illustrates a close-up of area 150 of FIG. 1A.

FIG. 1C illustrates the conventional technique used in wire bond technology wherein a bond ball 110 is electrically connected to a respective bonding pad 104 on a conventional test die.

FIG. 2A illustrates a top view of one embodiment of the test die of the present invention.

FIG. 2B illustrates a close-up of the area 250 of FIG. 2A.

FIG. 2C illustrates the technique of the present invention for electrically connecting a respective interconnect 210 to a plurality of bonding pads 204.

FIG. 2D illustrates a cross-sectional view of a portion of the test die 200 of FIG. 2A, taken along the lines 2D.

FIG. 3A illustrates a cross-sectional view of an alternate embodiment of the test die of the present invention.

FIG. 3B illustrates the technique for electrically connecting a plurality of interconnects 210 to the bonding layer 304 of the test die of FIG. 3A.

DETAILED DESCRIPTION OF THE PREFERRED EMBODIMENT

FIG. 1A illustrates a conventional test die 100 used for testing wire bonding techniques and/or fine pad pitch development. FIG. 1B illustrates a close-up of the area 150 of FIG. 1A, showing a more detailed description of bond pads 104. FIG. 1C illustrates the conventional technique used in wire bonding technology, wherein a bond ball 110 is used to electrically connect a bond wire (not shown) to a respective bond pad 104. Typically, the bond ball 110 is a gold ball formed at the end of a bond wire. As shown in FIG. 1C, one bond ball 110 is electrically connected to a single, respective bond pad 104.

Conventionally, the test die 100 is mounted on a leadframe, whereupon the bond pads of the test die are electrically connected to external pins of the leadframe via a plurality of bonding wires (not shown).

Test die 100 has been specifically designed to approximate the size of features of an actual semiconductor die used within actual integrated circuit chip packages. Within the center of test die 100 is area 101, which typically contains a working integrated circuit. Since the nature of the test die 100 is for testing improved wire bonding techniques and/or fine pad pitch development, however, the actual integrated circuit which would occupy area 101 is typically not included as part of the test die; yet the area 101 which would have been occupied by the integrated circuit is reserved in order to allow the test die 100 to simulate as close as possible the conditions of an actual semiconductor die.

Electrical connections to the integrated circuit (IC) area 101 are made via a plurality of bonding pads 104, which are electrically connected to various parts of the integrated circuit via conductive traces 103. As the size of conventional transistors decrease, the area 101 occupied by the integrated circuit will correspondingly decrease. In order to reduce wasted space on the surface of the semiconductor die, it is preferably to locate the bond pads 104 as close as possible to the circuit. However, the pitch of the bond pad surrounding the IC area 101 is limited by conventional wire bonding technology, as discussed above.

When developing new wire bond technology, there are several important aspects for which to test in order to determine whether the new technology is capable of handling a reduction in the bond pad pitch. A first aspect which needs to be tested relates to the short circuiting of the gold wire bond balls (110 of FIG. 1C) used to electrically connect a bonding wire to a respective bond pad 104. Short circuiting of this nature typically occurs because the bond pads 104 are placed too close to each other, causing the bond balls 110 to contact each other or to overlap onto adjacent bond pads. Because of this phenomena, it is conventional practice to form the size of the bond pad 104 such that the area occupied by the bond ball 110 can be located completely within the area occupied by the bond pad 104. This is shown, for example, in FIG. 1C.

Another problem which frequently occurs is the short circuiting of bond balls due to insufficient spacing between each of the bond pads 104. As the space between each of the bond pads 104 decreases, short circuiting may occur by way of contact between adjacent bond balls. Thus, in order to minimize this phenomena, spacing between each of the bond pads 104 is maintained above a particular value in order to avoid contact between adjacent bond balls 110.

Another problem which is common to traditional wire bonding technology is the short circuiting of the bonding wires due to the wires being too close to each other. Such a problem frequently occurs where the effective pitch of the bond pads falls below a particular value such as, for example, less than 4.5 mils.

Yet another problem typically encountered is related to the bond balls 110 not bonding to the bond pads 104. As commonly known to those skilled in the art, the silicon substrate surface of the test die is not adequate for bonding a bond ball thereto. This is because the surface of the silicon substrate does not provide an adequate surface to which the bond balls 110 can adhere. Therefore, bonding pads 104 are provided on the silicon substrate surface 102 in order to provide a surface to which the bond balls 110 may adhere. Occasionally, however, when the wire bonding technique is improper, bond ball 110 will not adhere to the bond pad, thereby causing an open circuit to be formed.

The process of testing a particular wire bonding technique for fine pad pitch development involves several steps. First, as described previously, a conventional semiconductor test die must be designed and fabricated. After the test die has been fabricated, an automatic wire bonder must be carefully programmed so that the bonding wires may be accurately and precisely bonded to the respective bond pads on the die. After wire bonding the die to the leadframe, the interconnect bonds may be visually and manually inspected to ensure the quality of each bond. Such an inspection is commonly referred to as third optical inspection.

Next, the leadframe and test die are then encapsulated with packaging material using a transfer molding process. After encapsulation, each package is separated from other packages in a process commonly known as singulation.

During the transfer molding process, several short circuiting and/or open circuiting problems arise which require further testing. For example, as the packaging material encapsulates the leadframe and test die, the viscosity of the material moving across the bond area can cause the bond ball 110 to separate from bond pads 104, thereby creating an open circuit. This may be referred to as wire sweep. Additionally, as the viscous packaging material moves across the bond wires, it can cause the bond wires to move and contact adjacent bond wires, thereby creating a short circuit.

Because of the open circuiting and short circuiting problems related to encapsulation of the leadframe and test die, the package is electrically tested for short circuits after it has been encapsulated. This is typically accomplished by electrically testing each of the external pins of the leadframe. Conventionally, however, electrical test programs vary depending on the layout of the test die. The development of an electrical test program for conventional test dies typically requires the assistance of test support engineers, and entails the time-consuming procedures of debugging the test program and fighting for test time on a testing machine.

Additionally, since each bond pad on the test die 100 is electrically isolated from each other bond pad, there is no convenient method for testing open circuits other than visual inspection. Before the package is encapsulated, visual inspection of the interconnect bonds may readily be performed, but is a tedious process. A wire pull test may also be employed in order to determine if the interconnect is bonded to the bond pad. After encapsulation, however, X-rays must be taken of the package in order to visually inspect for wire sweep (i.e. bond wires which have been swept away due to the bond separating from the bond pad). This type of inspection is both tedious and costly.

Many of the problems associated with conventional test dies for wire bonding technology are overcome by the universal test die of the present invention. FIG. 2A illustrates a top view of one embodiment of the test die 200 of the invention. For convenience, the test die 200 of the present invention may be referred to as the universal short test die. One of its functions is to allow a user to quickly and cheaply test a particular inner lead interconnect technique for short circuits within the test package.

FIG. 2B shows a close-up of the area 250 of FIG. 2A. In FIG. 2B, it can be seen that a portion of the test die comprises a layer of electrically non-conductive substrate 202 such as, for example, silicon. Additionally, the test die 200 comprises a pattern of electrically conductive material over the substrate layer 202, wherein the pattern forms a continuous array of individual bonding areas 204, each of the bonding areas being electrically isolated from adjacent bonding areas by a gap. The conductive material may be comprised of any type of material known to those skilled in the art which is suitable for such a purpose, such as, for example, aluminum alloy, gold, or other metals. Additionally, although not shown, additional layers may be interposed between substrate layer 202 and the electrically conductive patterned layer 204. An example of such a layer is an insulating layer comprised of $SiO_2$.

FIG. 2D illustrates a cross-sectional view of the portion of the test die of FIG. 2B, taken along the lines 2D. In FIG. 2D, it can be seen that individual bonding areas 204 are physically isolated from each other, and that each of the bonding areas 204 overlays a portion of the substrate layer 202.

As explained above, the reduction of bond pad pitch for wire bond technology is limited because of the above-described problems related to short circuiting and open circuiting of integrated circuit chip packages. Therefore, it is conventional practice to limit the effective bond pad pitch of a semiconductor test die to at least 4.5 mils or greater. Test dies with pitches below 4.5 mils, for example, will typically encounter defects related to the above-described problem.

Contrary to conventionally accepted practice, however, the bond pads 204 of the test die 200 of the present invention have an effective pitch which is 25 microns or less. Preferably, the effective pitch of bond pads 204 may be as low as current technology allows, which, for example is 1.5 microns.

The design of the test die 200 of the present invention comprises an array of isolated aluminum metallization patterns uniformly deposited on top of a silicon wafer. There may or may not be understructures beneath these patterns. These patterns are simple geometries such as, for example, triangles, squares, pentagons, hexagons, octagons, etc. The patterns can be regular or irregular shapes. Moreover, the patterns are as small as the wafer fabrication process will allow, and as close together (but not touching each other) as the wafer fabrication process will allow. This is to ensure that no adjacent bond balls will come into contact with the same bond pad during the wire bond operation. An example of the dimensions of the array as shown in FIG. 2B are as follows: the surface area of each bond pad 204 is one square micron, and the gap or space between each adjacent bond pad is 0.5 microns. Such dimensions allow the array of bond pads to have an effective pitch of 1.5 microns.

The universal test die of the present invention provides for a number of unexpected advantages which, heretofore, have not been provided by conventional test dies. These advantages are explained in greater detail below.

FIG. 2C illustrates the novel technique for electrically bonding a plurality of interconnect bond balls 210 to the surface of the test die 200 of the present invention. As can be seen in FIG. 2C, each of the bond balls 210 is bonded to a respective multiplicity of bonding areas 204, wherein each bond ball is electrically isolated from each other bond ball.

Recall that conventional wire bonding techniques teach that each bond ball must be electrically bonded to a single, respective bond pad, as shown, for example, in FIG. 1C. The technique of the present invention differs from the conventional wire bonding technique in that bond balls 210 are connected to a multiplicity of bond pads 204. Because each of the bond pads 204 are electrically isolated from each other bond pad, each bond ball 210 will also be electrically isolated from each other bond ball 210. In this way, the spacing between adjacent bond ball 210 is not limited by the effective pitch of the bond pads 204. Thus, using the universal test die 200 of the present invention, improved techniques in the area of wire bond technology may be tested without the undue complications associated with conventional test dies.

For example, an entire silicon wafer may be coated with a pattern of electrically conductive material as shown in FIG. 2A. As the fabrication process for the above-described grid array is commonly known to those skilled in the art, no new or complex design layout is required for each test chip. Moreover, the fabrication process is more rapid than that of conventional test die fabrication. For example, conventional test dies may take up to ten weeks to fabricate, whereas the universal test die 200 of the present invention may only take one week to fabricate.

After a wafer has been fabricated with the electrically conductive pattern as shown in FIGS. 2A and 2B, individual test dies may then be easily and rapidly produced by cutting or sawing away a portion of the wafer such that the separated portion forms a test die which approximates the surface area dimensions of an actual integrated circuit die which is desired to be emulated. Thus, the universal test die of the present invention can be easily formed to emulate any one of a number of different package types including, but not limited to, MQFP, TQFP, PBGA and HPBGA packages, and can also be formed to emulate any desired body size for each type of package. Moreover, the universal test die of the present invention can be formed to emulate a particular body size of a particular package type without the conventional need to design and fabricate a new test die specific to that body size and package type.

Additionally, the universal test die of the present invention can be utilized for testing the effectiveness of wire bonding techniques for any desired bond pad pitch. That is to say, the bonding technique for any desired pitch may be tested on the universal die of the present invention without incurring problems associated with conventional test dies. For example, if a new bonding technique is to be tested using an effective pitch of 3 mils, all that need be done is to design a wire bond program on an automatic wire bonder for bonding the interconnects to the universal test die according to calculated bond locations having an effective pitch of 3 mils (as opposed to the conventional technique of visually locating each of the bond pads using the wire bonder monitor). Moreover, no new die layout need be designed or fabricated, as is required with conventional test dice.

Furthermore, the universal test die of the present invention can be used to test wire bonding techniques for any type of bond pad formation such as, for example, linear bond pad rows and/or staggered bond pad rows.

Another advantage of the universal test die of the present invention is that it provides a built-in safety factor when testing the quality of the interconnect bonds (i.e., third optical inspection). To explain, as stated previously, the silicon substrate surface of the test die does not provide an adequate surface for bonding a bond ball thereto. Thus, in conventional wire bonding techniques, it is desirable for 100% of the bond ball interface to contact the surface of the bond pad in order to form the strongest bond possible. However, unlike conventional techniques, the technique of the present invention bonds a single bond ball 210 to a multiplicity or plurality of bond pads 204 as shown, for example, in FIG. 2C. Because of this, some of the surface area of the bond ball 210 which contacts the test die 200 does not make contact with any of the bond pads 204. Thus, the quality of the interconnect bond on the test die 200 will be slightly weakened as compared to the conventional technique, providing a built-in safety factor for testing the quality of each interconnect bond. In other words, if an interconnect bond on the test die of the present invention passes the third optical inspection, it can be inferred that the quality of the interconnect bond will be even stronger when the bond is used in an actual integrated circuit chip package, where 100% of the surface area of the bond ball interface contacts a single bond pad on the silicon die.

The following description illustrates how the test die 200 of the present invention is used for testing new or improved wire bond technology.

First, a silicon wafer is processed in accordance with the description above to provide a pattern forming an aluminum grid array, as shown, for example, in FIGS. 2A and 2B. Next, a portion of the wafer is sawed to the specific dimensions of an actual semiconductor die which is desired to be emulated. It is to be noted that the test die of the present invention may also be formed using other techniques such as, for example, cutting, stamping, or punching.

Next, a wire bond program is developed for attaching the wire bonds to the test die according to a specified bond pad pitch and pin count.

After the wire bonds have been connected, the leadframe and test die are encapsulated in plastic packaging, and then separated from other packages in a singulation process. At this point, each of the bond wires should be electrically isolated from each of the other bond wires, as explained above. The external pins of the leadframe are then tested in order to determine if any short circuits exist within the package.

Using the universal test die of the present invention, the testing of wire bond technology or other types of technology using test dies may be performed both cheaper and faster than that of conventional test dies. An additional advantage of the universal test die of the present invention is that, after encapsulation of the package, only one test program need be developed for electrically testing packages having a particular pin count.

An alternate embodiment of the present invention is illustrated in FIGS. 3A and 3B. FIG. 3A illustrates a second embodiment of the test die 300 of the present invention comprising a layer of electrically conductive material 304 forming a continuous sheet over a layer of silicon substrate 202. One of the principal differences between the embodiment of the test die in FIG. 2D and the embodiment of the test die in FIG. 3A is that test die 300 has a continuous sheet of electrically conductive material 304 over the substrate layer, rather than individual islands 204 as shown in FIG. 2D. The test die 300 of the present invention may be conveniently referred to as a universal open test die. One of its functions is to allow the user to quickly and cheaply test a particular inner lead interconnect technique for open circuits within the test package.

In an alternate embodiment (not shown) the test die 300 may be modified such that it does not include the layer of electrically non-conductive substrate 202. Alternatively, additional layers/structures may be interposed between substrate layer 202 and conductive layer 304, such as, for example an insulating layer comprised of $SiO_2$. What is important is that a continuous layer of electrically conductive material be provided in order to bond inner lead interconnects thereto.

FIG. 3B illustrates a technique for electrically connecting a plurality of interconnects 210 to the bonding layer 304 of the test die 300 of FIG. 3A. The advantages of the test die 300 of the present invention are similar to the advantages of the test die 200 of the invention, and therefore will not be repeated.

The following description illustrates how the test die 300 of the present invention is used for testing improvements in inner lead interconnect technology.

First, a silicon wafer is processed to form a continuous sheet-like bonding layer of electrically conductive material over the silicon substrate layer, as shown in FIG. 3A. Next a portion of the silicon wafer is sawed off to form a test die 300. A plurality of inner lead interconnects 210 are then bonded to the surface of bonding layer 304, thereby causing each of the plurality of interconnects to be electrically connected to each other and to bonding layer 304. After encapsulation and singulation, the test package may then be tested for open circuits such as, for example, by electrically testing the external pins of the package to ensure that each of the pins is electrically connected to each of the other pins and to bonding layer 304. In this way, universal test die 300 of the present invention provides an advantage over conventional test dies in that the process for detecting open circuits or wire sweep is greatly simplified and less costly. Whereas conventional techniques require tedious visual inspection of the X-rays of the interconnect bonds within conventional IC test packages, the technique of the present invention allows the integrity of the interconnect bonds to be easily and quickly tested through automated electrical testing procedures, rather than through tedious visual inspection of the test package.

It is to be noted that in addition to wire bond technology, the test die and method of the present invention can also be used for testing other types of interconnect technology such as, for example, solder ball (flip chip) technology, and tape automated bonding (TAB) technology which includes both gang bonding and single point bonding. Additionally, it is to be noted that the inner lead interconnects may be used not only for electrical die-to-leadframe connection, but may also be used for the electrical connection of other circuit components such as: die-to-die, leadframe-to-leadframe, die-to-PC board, etc.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

What is claimed is:

1. A universal semiconductor interconnect test structure comprising:

a layer of electrically non-conductive substrate;

a bonding layer of electrically conductive material forming continuous sheet entirely covering said substrate layer;

a plurality of die bond interconnects bonded to said bonding layer and electrically connected thereto, each of said plurality of die bond interconnects being electrically connected to each other through the bonding layer.

2. The test structure of claim 1 wherein said plurality of die bond interconnects is selected from the group consisting of: wire-bond interconnects, solder-ball grid array interconnects, and interconnects for tape automated bonding.

3. The test structure of claim 2 wherein said layer of electrically non-conductive substrate comprises silicon.

4. The test structure of claim 3 wherein said bonding layer comprises a continuous layer of aluminum.

5. The test structure of claim 2 wherein said plurality of die bond interconnects comprise wire-bond interconnects which include a plurality of bonding wires and a plurality of bond balls for bonding and electrically connecting each of the bonding wires to a respective bond pad of said plurality of bond pads.

6. The test structure of claim 5 further comprising a body of electrically non-conductive material encapsulating said plurality of die bond interconnects, at least a portion of said substrate layer, and at least a portion of said bonding layer.

7. A universal semiconductor interconnect test die comprising:

a layer of electrically non-conductive substrate; and a pattern of electrically conductive material over said substrate layer, said pattern forming an array of individual bonding areas, wherein the bonding areas are electrically isolated from one another, wherein each of said bonding areas is electrically isolated from adjacent bonding areas by a gap, and wherein an effective pitch of said bonding areas is not more than 25 microns.

8. The test die of claim 7 wherein each of said bonding areas has a shape selected from the group consisting of: circles, rectangles, parallelograms, and triangles.

9. A universal semiconductor interconnect test structure comprising:

a layer of electrically non-conductive substrate;

a pattern of electrically conductive material over said substrate layer, said pattern forming an array of individual bonding areas, wherein each of said bonding areas is isolated from adjacent bonding areas by a gap; and a plurality of die bond interconnects bonded to said plurality of bonding areas, wherein each die bond interconnect is bonded to a respective multiplicity of bonding areas of said plurality of bonding areas, and wherein each die bond interconnect is electrically isolated from each other die bond interconnect of said plurality of die bond interconnects, wherein the bonding areas in each respective multiplicity of bonding areas are electrically connected but the other bonding areas are electrically isolated from one another.

* * * * *